United States Patent
Li et al.

(10) Patent No.: US 6,427,214 B1
(45) Date of Patent: Jul. 30, 2002

(54) INTERLEAVER USING CO-SET PARTITIONING

(75) Inventors: Bin Li; Wen Tong, both of Ottawa; Jian Cui, Nepean; Rui R. Wang, Ottawa, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/409,317

(22) Filed: Sep. 28, 1999

Related U.S. Application Data

(60) Provisional application No. 60/102,250, filed on Sep. 29, 1998.

(51) Int. Cl.$^7$ .............................................. H03M 13/27
(52) U.S. Cl. ........................................ 714/701; 714/788
(58) Field of Search .................................. 714/701, 702, 714/791, 788

(56) References Cited

U.S. PATENT DOCUMENTS

| | | | | |
|---|---|---|---|---|
| 4,394,642 A | * | 7/1983 | Currie et al. ................... | 341/81 |
| 4,918,600 A | * | 4/1990 | Harper et al. ................. | 711/157 |
| 5,111,389 A | * | 5/1992 | McAuliffe et al. ........... | 711/200 |
| 5,133,061 A | | 7/1992 | Melton et al. ............... | 395/425 |
| 5,276,826 A | * | 1/1994 | Rau et al. ..................... | 710/60 |
| 5,377,340 A | * | 12/1994 | Seroussi et al. ............. | 711/216 |
| 5,535,220 A | * | 7/1996 | Kanno et al. ................. | 370/515 |
| 6,023,783 A | * | 2/2000 | Divsalar et al. ............. | 375/262 |

FOREIGN PATENT DOCUMENTS

| | | |
|---|---|---|
| EP | 0 928 071 A | 7/1999 |
| WO | WO 97/40582 A | 10/1997 |

OTHER PUBLICATIONS

Dunscombe et al., "Optimal Interleaving scheme for Convolutional Coding", Electronics Letters, Oct. 26, 1989, vol. 25, No. 22, pp. 1517–1518.*

Barbulescu et al., "Interleaver Design for Turbo Codes", Electronics Letters, Dec. 8, 1994, vol. 30, No. 25., pp 2107–2108.*

Divsalar et al., "Multiple Turbo Codes for Deep–Space Communications", TDA Progres Report 42–121, May 15, 1995, pp. 66–77.*

\* cited by examiner

*Primary Examiner*—Stephen M. Baker
(74) *Attorney, Agent, or Firm*—Gibbons, Del Deo, Dolan, Griffinger & Vecchione

(57) ABSTRACT

Construction of a Turbo code interleaver for blocks of any size is facilitated by partitioning the block into co-sets of predetermined size, permuting each co-set with an interleaver whose parameters are selected and optimized for the predetermined size, and recombining the elements of the permuted co-sets according to a predetermined order. Partitioning of the block into co-sets is accomplished by choosing a value n for the number of co-set, and assigning to each co-set those positions of the block having a common value for modulo-n of the block size. The permuted output may be punctured to maintain a desired ratio.

30 Claims, 4 Drawing Sheets

INTERLEAVER USING CO-SET PARTITIONING

CROSS-REFERENCE TO RELATED APPLICATIONS

This application claims the benefit of U.S. Provisional Application No. 60/102,250 filed Sep. 29, 1998.

FIELD OF THE INVENTION

This invention relates to communications systems and, more particularly, to interleavers for performing code modulation.

BACKGROUND OF THE INVENTION

Encoding communication channels, i.e., coded modulation, has been found to improve the bit error rate (BER) of electronic communication systems such as modem and wireless communication systems. Turbo coded modulation has proven to be a practical, power-efficient, and bandwidth-efficient modulation method for "random-error" channels characterized by additive white Gaussian noise (AWGN) or fading. These random-error channels can be found, for example, in the Code Division Multiple Access (CDMA) environment.

The key innovation of Turbo Codes is an interleaver which permutes the original data frame before input to a second encoder. A conventional parallel concatenated Turbo Encoder is shown in FIG. 1. The Turbo Encoder includes two constituent encoders 102 and 104, and one interleaver 106. Switch 108 can puncture alternate bits from each of encoders 102 and 104 so as to maintain the desired ratio (e.g., R=1/2). The construction and operation of the constituent encoder and the selection of a ratio are well known and thus will not be discussed further herein. However the construction of the interleaver remains an open issue; especially for the small block size of Turbo Code.

Presently, a conventional "random interleaver" is considered the best if the data frame size goes to infinity in an Additive White Gaussian Noise(AWGN) channel such as a CDMA channel. However, the best interleaver for data frames of finite size (i.e. Turbo Code) is yet to be determined.

Accordingly, there exists a need for interleaver designs for data frames of finite size. It is thus an advantage of the present invention to provide interleavers for data frames of finite size (i.e. Turbo Code). It is another advantage of the present invention to provide optimized interleavers for frames of predetermined size.

SUMMARY OF THE INVENTION

In accordance with the teachings of the present invention, these and other advantages may be accomplished by the present systems and methods of interleavers using co-set partitioning.

An embodiment of the invention provides a method of permuting a block containing N data elements, where N is a positive integer greater than 1 and integrally divisible by a positive integer n greater than 1, comprising partitioning said block into n co-sets each of size N/n; permuting each co-set; and forming a permuted block by combining elements of said permuted co-sets in a predetermined order.

An aspect of the invention provides a system and method for partitioning said block into n co-sets by assigning to each of the n co-sets elements whose relative positions in said block have a common value of (N modulo(n)).

An aspect of the invention provides for permuting each co-set in an algebraic interleaver building block adapted to the size of the co-set.

An aspect of the invention provides for applying co-set partitioning and interleaving several times.

An aspect of the invention provides for permuting each co-set by generating an m-sequence according to the co-set.

Another embodiment of the invention provides a system and method of producing Turbo code from a stream of N system bits where N is a positive integer greater than 1 and integrally divisible by a positive integer n greater than 1, comprising encoding the N system bits in a first encoder to produce a first stream of N Turbo bits; partitioning said stream of N system bits into n co-sets each of size N/n; permuting each co-set; forming a permuted stream of N system bits by combining permuted said co-sets in a predetermined order; encoding the N permuted system bits in a second encoder to produce a second stream of N Turbo bits; and combining said first and second streams of N Turbo bits in a predetermined order.

An aspect of the invention provides for partitioning the stream of N system bits into n co-sets by assigning to each of said n co-sets elements whose relative positions in the stream have a common value of (N modulo(n)).

An aspect of the invention provides for applying the co-set partitioning and interleaving several times.

An aspect of the invention provides for producing two streams of Turbo bits from a stream of system bits, and puncturing the two streams of N Turbo bits to maintain a predetermined ratio of system bits to Turbo bits.

The invention will next be described in connection with certain exemplary embodiments; however, it should be clear to those skilled in the art that various modifications, additions, and subtractions can be made without departing from the spirit or scope of the claims.

BRIEF DESCRIPTION OF THE DRAWINGS

The invention will be more clearly understood by reference to the following detailed description of an exemplary embodiment in conjunction with the accompanying drawings, in which.

DETAILED DESCRIPTION OF THE INVENTION

Figure 1:
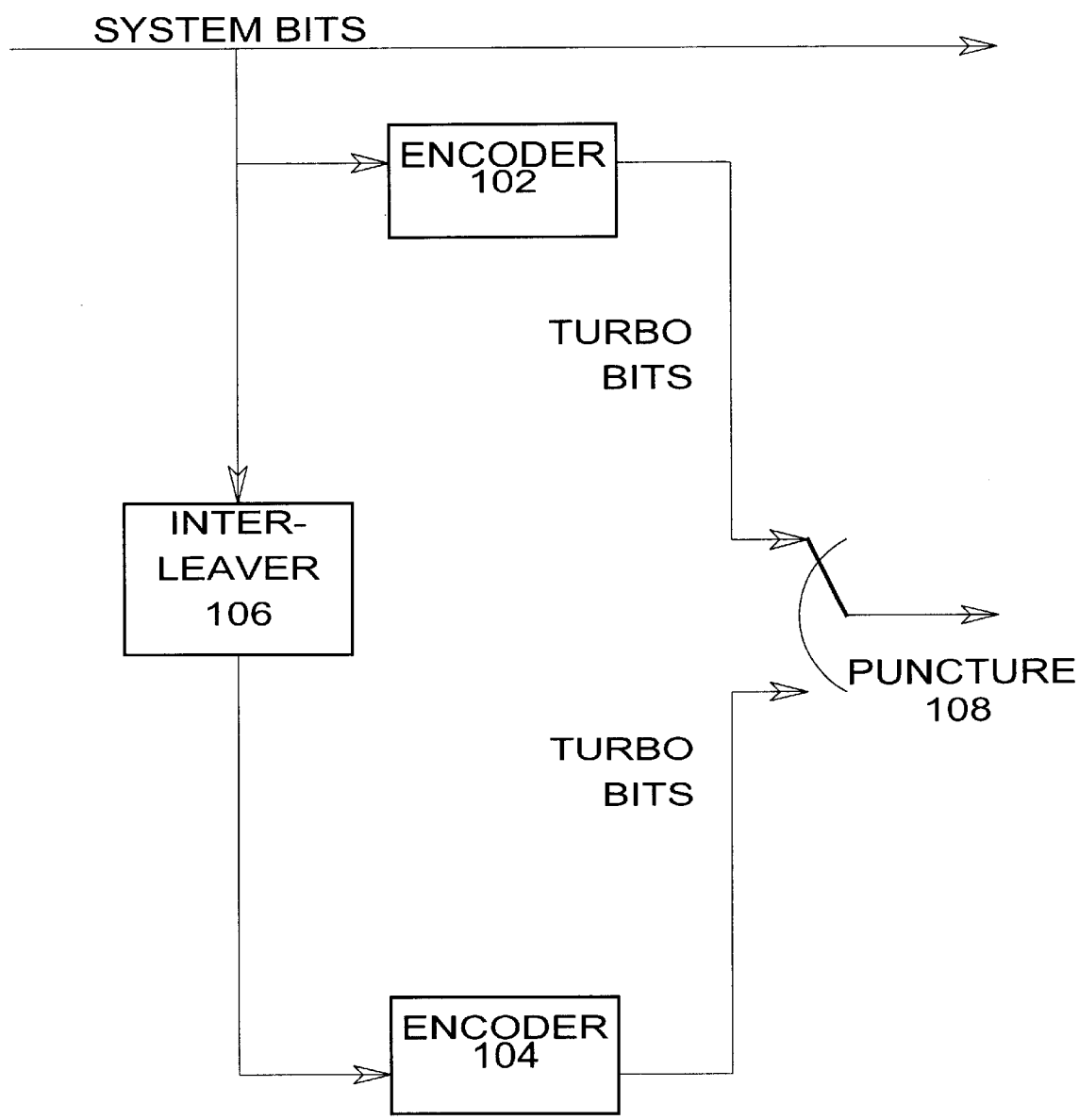
FIG. 1 is a block diagram of a conventional parallel concatenated Turbo Encoder.

The present invention discloses an interleaver which improves the performance of conventional Turbo Code. An embodiment of the invention employs an algorithm to construct an arbitrary size algebraic interleaver based on smaller size interleavers by exploiting the concept of mapping by set partitioning. This technique allows for the parameterization of the algebraic interleaver and for interleaver optimization based on selected criteria.

The described embodiment compensates for the loss of parity bits caused by puncturing of a parallel concatenated Turbo Code. By employing a co-set partitioned algebraic interleaver, the performance of punctured Turbo Code (especially for R=1/2) is improved. The invention may be realized in software or hardware (i.e. application specific integrated circuits (ASIC), programmable logic arrays (PLA), or any other suitable logic device).

While the present disclosure discusses an embodiment of interleavers with respect to Turbo Codes and cdma2000, those skilled in the art will appreciate that these interleavers may also be used in other systems such as present-day CDMA, and with other codes as well.

Construction of Algebraic Interleaver Based on Co-Set Partitioning

The design of the present interleaver is based on a deterministic algebraic structure. It employs the idea of co-set partitioning to design an algebraic interleaver that can interleave blocks of arbitrary size by partitioning the block into smaller co-set sub-blocks and using smaller sized algebraic interleavers to interleave the co-sets. Elements from the interleaved co-sets are then combined in a predetermined order to form the interleaved version of the original block.

The co-set partitioning is accomplished in a present embodiment by assigning to each of n co-sets elements of the block that share the same residual of a modulo-n calculation.

For example, a block containing 12 elements identified as
{1 2 3 4 5 6 7 8 9 10 11 12}
could be partitioned into 2 co-sets containing {1 3 5 7  9 11} (modulo-2 residual = 1)

{2 4 6 8 10 12} (modulo-2 residual = 0)

or into 3 co-sets containing

{1 4 7 10} (modulo-3 residual = 1)

{2 5 8 11} (modulo-3 residual = 2)

{3 6 9 12} (modulo-3 residual = 0)

or into 4 co-sets containing

{1 5  9} (modulo-4 residual = 1)

{2 6 10} (modulo-4 residual = 2)

{3 7 11} (modulo-4 residual = 3)

{4 8 12} (modulo-4 residual = 0)

(Although the block could also be partitioned into 6 co-sets of two elements each, the results of permuting the two-element co-sets would probably not be of practical use.)

An example will now be considered in detail of interleaving a block having 48 data elements, identified as elements 1 through 48. The block will be divided into two co-sets, one containing those of elements 1 through 48 that have a modulo-2 residue of 0 (i.e., the 24 "even-numbered" elements 2, 4, 6, . . . 48) and one containing those that have a modulo-2 residue of 1 (i.e., the 24 "odd-numbered" elements 1, 3, 5, . . . 47). The two blocks may be referred to in this discussion as the even block and the odd block. Those skilled in the art will appreciate that the choice of two as the number of co-sets is exemplary and not limiting. Each of the two blocks will be permuted row-by-row and column-by-column.

Each of the 24-element blocks is treated as a four-row by six-column array—i.e., as an $N_1 \times N_2$ array where $N_1$ is chosen to be 4 and $N_2$ is accordingly chosen to be 6. Those skilled in the art realize that these numbers are exemplary and that other numbers could be chosen. Prime numbers $P_1$ and $P_2$ are then chosen. $P_1$ is a prime number greater than $N_1$; it is preferably the least prime number greater than $N_1$, but the method will work if greater prime numbers are chosen. Accordingly, a value of 5 is chosen for $P_1$, since 5 is the least prime number greater than 4 (which is the value of $N_1$). Similarly, a value of 7 is chosen for $P_2$, since 7 is the least prime number greater than 6 (which is the value of $N_2$). Values of $\alpha_1$, $\alpha_2$, $\beta_1$ and $\beta_2$ are then chosen: values $\alpha_1$ and $\alpha_2$ are initial roots of $P_1$ and $P_2$, respectively, found by conventional methods. $\beta_1$ and $\beta_2$ may be selected for optimum results from $$\beta_1 \leq P_1 - 1 \text{ and } \beta_2 \leq P_2 - 1.$$

In the present example, $\alpha_1=2$, $\alpha_2=3$, $\beta_1 1$, and $\beta_2 3$.

The block to be interleaved is read in to the $N_1$ by $N_2$ array in a row-by-row manner. Thus, the even block is read in as 02 04 06 08 10 12

14 16 18 20 22 24

26 28 30 32 34 36

38 40 42 44 46 48

Then the row indices $i_{row}(n)$ are permuted according to:

for n=1, 2, . . . , $P_1-1$
$i_{row}(n) = \alpha_1^{n+\beta 1} \mod(P_1)$
puncture $i_{row}(n) > N_1$ Accordingly, for rows 1, 2, 3, and 4 of the present example:

$i_{row}(1) = 2^{1+1} \mod 5 = 4 \mod 5 = 4$ $i_{row}(2) = 2^{2+1} \mod 5 = 8 \mod 5 = 3$ $i_{row}(3) = 2^{3+1} \mod 5 = 16 \mod 5 = 1$ $i_{row}(4) = 2^{4+1} \mod 5 = 32 \mod 5 = 2$ Thus, the former row 1 becomes row 4, the former row 2 becomes row 3, etc., yielding:

26 28 30 32 34 36

38 40 42 44 46 48

14 16 18 20 22 24

02 04 06 08 10 12

Next, the column indices $i_{col}(n)$ are permuted according to:

for n=1, 2, . . . , $P_2-1$
$i_{col}(n) = \alpha_2^{n+\beta 2} \mod(P_2)$
puncture $i_{col}(n) > N_2$ Accordingly, for columns 1, 2, 3, 4, 5, and 6 of the present example:

$i_{col}(1) = 3^{1+3} \mod 7 = 81 \mod 7 = 4$ $i_{col}(2) = 3^{2+3} \mod 7 = 243 \mod 7 = 5$ $i_{col}(3) = 3^{3+3} \mod 7 = 729 \mod 7 = 1$ $i_{col}(4) = 3^{4+3} \mod 7 = 2187 \mod 7 = 3$ $i_{col}(5) = 3^{5+3} \mod 7 = 6561 \mod 7 = 2$ $i_{col}(6) = 3^{6+3} \mod 7 = 19683 \mod 7 = 6$ Thus, the former column 1 becomes column 4, the former column 2 becomes column 5, etc., yielding:

```
30 34 32 26 28 36
42 46 44 38 40 48
18 22 20 14 16 24
06 10 08 02 04 12
```

Next, a cyclic shift of the rows by $\beta_1$ rows (1 row) is performed, yielding:

```
42 46 44 38 40 48
18 22 20 14 16 24
06 10 08 02 04 12
30 34 32 26 28 36
```

Next, a cyclic shift of the columns by $\beta_2$ columns (3 columns) is performed, yielding:

```
38 40 48 42 46 44
14 16 24 18 22 20
02 04 12 06 10 08
26 28 36 30 34 32
```

Reading out the interleaved even block in a column-by-column manner results in the interleaver output index of:

38, 14, 02, 26, 40, 16, 04, 28, 48, 24, 12, 36, 42, 18, 06, 30, 46, 22, 10, 34, 44, 20, 08, 32.

Similar processing is employed to interleave the odd block (the 24 odd elements of the 48-element block being considered). The interleaved co-sets are recombined according to a predetermined order. Blocks of a size that is not numerically convenient to handle may be padded to a convenient size for permuting, and the padding positions may be discarded after permuting. For example, a block of 45 elements could have extra elements 46, 47, and 48 added before being permuted as in the present example, and elements 46, 47, and 48 could be discarded after permuting.

Thus, a basic algebraic interleaver building block of a particular size (here, 24) has been given parameters which may be expressed as $\pi\{\alpha_1, \alpha_2, \beta_1, \beta_2\}$ where $\pi$ connotes the interleaver block, and the roots $\{\alpha_1, \alpha_2\}$ and shifts $\{\beta_1, \beta_2\}$ can be selected against different optimization criteria specified for an algebraic interleaver and refined to their optimum values for the building block size.

Figure 2:
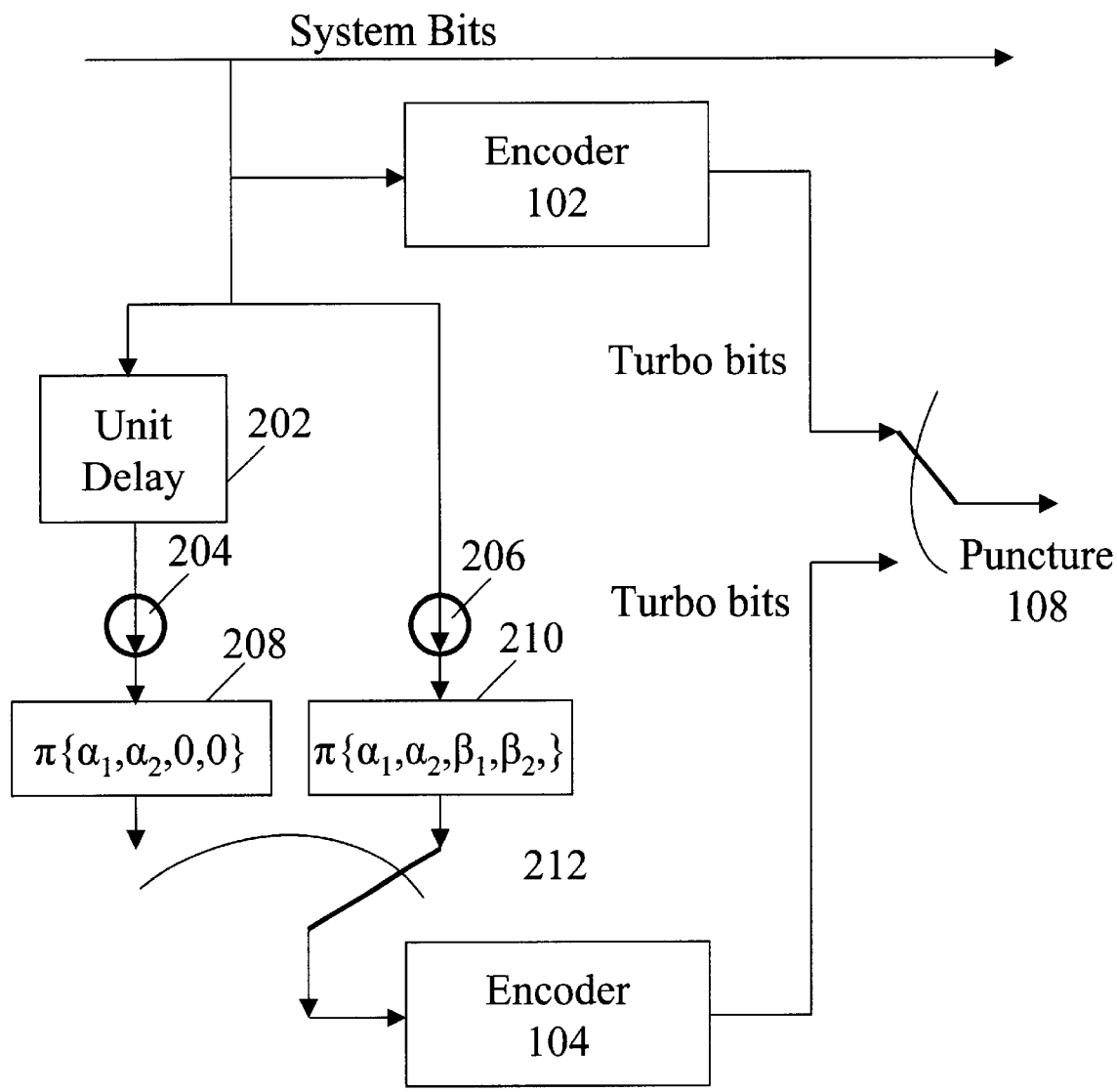
FIG. 2 is a block diagram of a parallel concatenated Turbo Encoder using algebraic co-set interleavers according to the present invention.

An example of a Turbo Encoder using such a co-set interleaver is shown in FIG. 2. In this example the input sequence is split into two co-sets, one comprising the even-numbered bits of the input sequence and one comprising the odd-numbered bits. Elements 204 and 206 are decimators which pass every second element routed to them. In conjunction with unit delay 202 in the path to only one of decimators 204 and 206, this has the effect of passing a co-set consisting of the sequence of odd system bits (1, 3, ...) to interleaver building block 210, and a co-set consisting of the sequence of even system bits to interleaver building block 208. Those skilled in the art realize that other passing schemes can be used.

The starting positions of switches 108 and 212 are initialized to the positions shown in FIG. 2. They then toggle synchronously with the flow of bits through the Turbo Encoder of FIG. 2. Switch 212 thus reconstitutes a single block for input to encoder 104, consisting of the first element output from interleaver 210, the first element output from interleaver 208, the second element output from interleaver 210, and so on. In the absence of switch 108 the configuration of FIG. 2 would output a bit stream with a ratio R=1/3 (one system bit and two Turbo bits out for every system bit in). Switch 108 punctures alternate Turbo bits from each of encoders 102 and 104 so that the output has a ratio R=1/2.

The algebraic interleaver building block (co-set) is chosen with size $N_0=N/2$, where N is the size of the block to be interleaved. The choice of N/2 for the value of $N_0$ is a design choice; those skilled in art realize that other building-block sizes are possible. Each building block is then assigned a number $N_1$ of rows and a number $N_2$ of columns, with $N_1 \times N_2 = N_0$. For the first building block the parameters chosen are $\{\alpha_1, \alpha_2, 0, 0\}$, and for the second building block the chosen parameters are $\{\alpha_3, \alpha_4, \beta_1, \beta_2\}$. The parameterized interleaver can be optimized by choosing appropriate values with respect to the Turbo Code performance. Table 1 illustrates a set of optimized parameters determined for the Turbo Codes specified in cdma2000.

TABLE 1

| Data Rate (kbps) | Frame Size N | $N_1, N_2$ | $P_1, P_2$ | $\alpha_1, \alpha_2, \alpha_3, \alpha_4, \beta_1, \beta_2$ |
|---|---|---|---|---|
| 9.6 | 192 | 16, 6 | 17, 7 | 7, 5, 5, 3, 7, 2 |
| 14.4 | 288 | 16, 9 | 17, 11 | 6, 6, 3, 6, 2, 4 |
| 19.2 | 384 | 16, 12 | 17, 13 | 3, 6, 6, 6, 14, 6 |
| 28.8 | 576 | 16, 18 | 17, 19 | 3, 13, 6, 13, 0, 9 |
| 38.4 | 768 | 16, 24 | 17, 29 | 3, 2, 6, 2, 0, 11 |
| 57.6 | 1152 | 16, 36 | 17, 37 | 2, 3, 20, 3, 29, 6 |

In alternative practices of the invention, co-set partitioning may be performed more than once. In the above example where the columns 1, 2, 3, 4, 5, and 6 of the even co-set are permuted to columns 4, 5, 1, 3, 2, and 6, further co-set partitioning might be performed taking the new first, third, and fifth columns as one co-set and the new second, fourth, and sixth columns as another co-set, producing two co-sets

```
30 32 28        34 26 36
42 44 40   and  46 38 48
18 20 16        22 14 24
06 08 04        10 02 12
``` which are then each subjected to row and column cyclic shifts as in the above example.

In other practices of the invention, each row or column shift may use a different value. That is, the value of $\beta$ can be row-independent, or column-independent, or both.

Punctured Turbo Codes With No Loss of Turbo Code Bits

Figure 3:
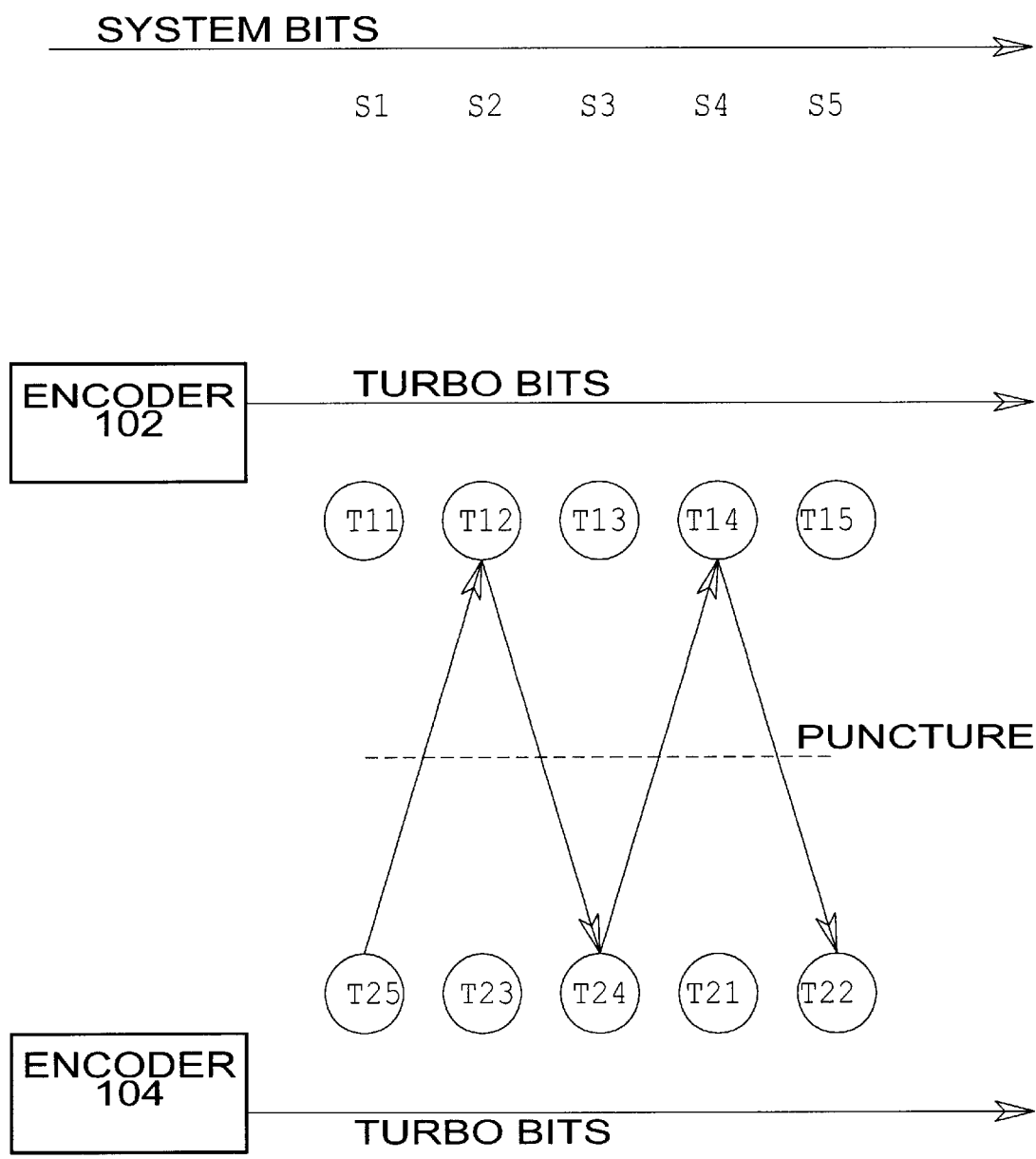
FIG. 3 depicts data loss due to puncturing in the conventional Turbo Encoder of FIG. 1.

An additional advantage gained from practicing the present invention's co-set partitioning with the number of co-sets chosen as two is that puncturing to attain a particular ratio R (as by switch 108 of FIG. 2) will not puncture both Turbo Code bits corresponding to a particular system bit. FIG. 3 shows that for the conventional Turbo Encoder of FIG. 1, showing five system bits connoted S1 through S5, and taking system bit S2 as an example, its corresponding Turbo Code bits T12 and T22 are both lost in puncturing (for an assumed order of interleaved bits). Since one of those bit streams is being interleaved relative to the other, it cannot be guaranteed that this will not occur. When decoding at a destination, there is a decreased likelihood of correct interpretation of system bit 2.

According to the present invention wherein the input sequence is partitioned into an even sequence and an odd sequence, interleaving is performed separately on each sequence, and the sequences are subsequently recombined, each system bit will retain one of its corresponding Turbo Code bits after puncturing.

Figure 4:
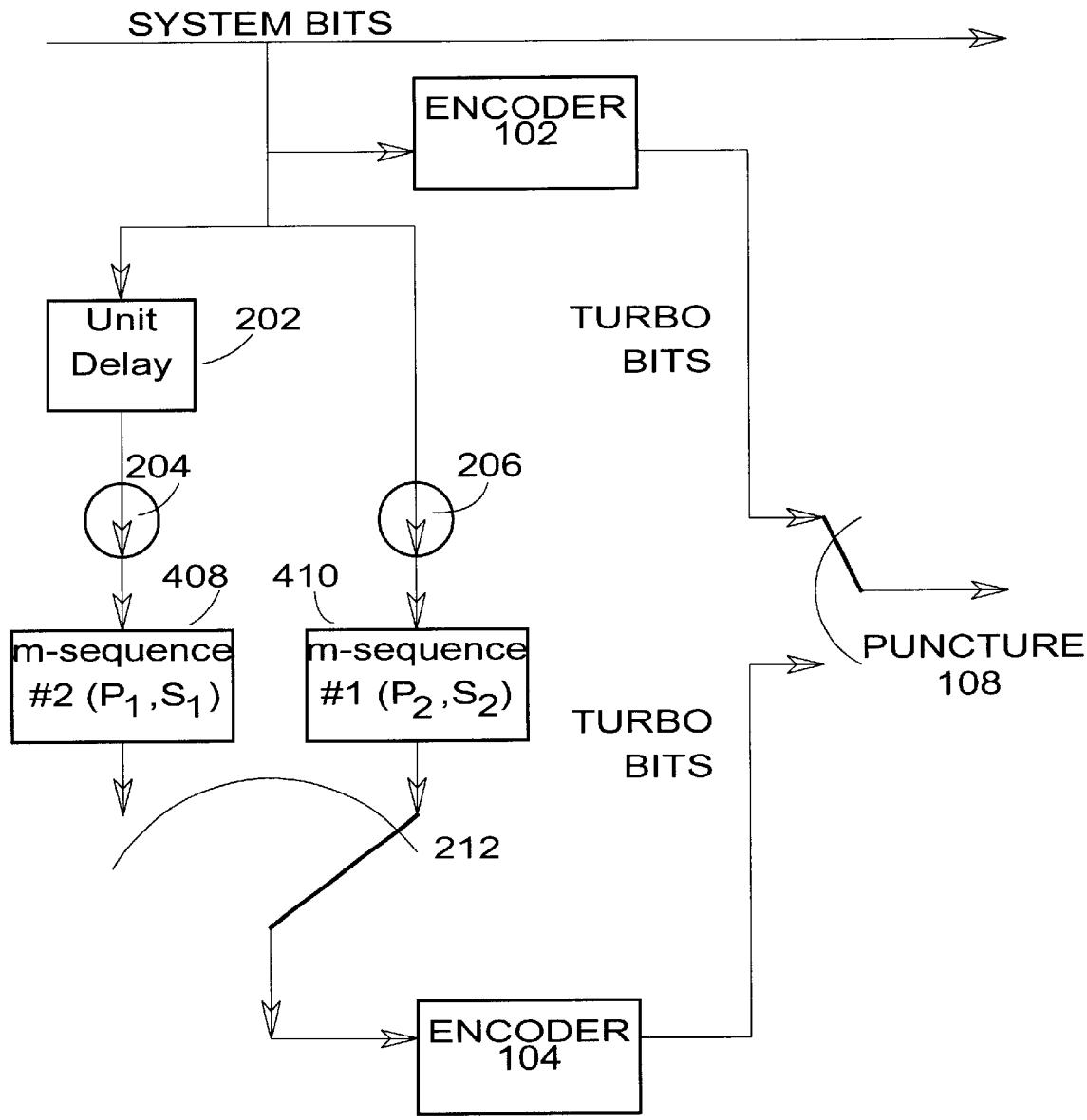
FIG. 4 is a block diagram of a parallel concatenated Turbo Encoder using m-sequence generators as co-set interleavers according to the present invention.

Further, a single pseudo random sequence generator (e.g., m-sequence, M-sequence, Gold sequence, Kasami sequence, etc.) can be employed as the interleaver building block, or as illustrated in FIG. 4, two m-sequence generators 408 and 410 are combined to form an interleaver for co-set partitioning.

It will thus be seen that the invention provides advantageous interleaving for use in a Turbo Encoder for encoding frames of finite size. Those skilled in the art will appreciate that the configurations depicted in FIGS. 2 and 4 provide Turbo Encoders with co-set partitioning.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A method of permuting a block of data elements, comprising:
    partitioning said block into a plurality of co-sets;
    permuting each co-set; and
    forming a permuted block by combining elements of said permuted co-sets in a predetermined order.

2. The method according to claim 1 wherein:
    said block contains N data elements, where N is a positive integer greater than 1 and integrally divisible by n, a positive integer greater than 1; and
    the step of partitioning said block into co-sets comprises assigning to each of n co-sets elements whose relative positions in said block have a common value of (N modulo(n)).

3. The method according to claim 2 wherein the value of n is 2, whereby a first co-set contains all odd-numbered elements of said block and a second co-set contains all even-numbered elements of said block.

4. The method according to claim 1 wherein the step of permuting each co-set comprises:
    reading each co-set in a row-by-row manner into an array having $N_1$ columns and $N_2$ rows where $N_1 \times N_2$ is equal to N/n where N is a number of elements in said block and n is a number of co-sets;
    choosing prime numbers $P_1<N_1$, and $P_2<N_2$;
    determining $\alpha_1$ and $\alpha_2$ as the roots of $P_1$ and $P_2$;
    selecting values $\beta_1$ and $\beta_2$;
    permuting the row indices of said array as a function of $\alpha_1$ and $\beta_1$;
    permuting the column indices of said array as a function of $\alpha_2$ and $\beta_2$;
    cyclically shifting the rows of said array by $\beta_1$ rows;
    cyclically shifting the columns of said array by $\beta_2$ columns; and
    reading each co-set out of said array in a column-by-column manner.

5. The method according to claim 1 wherein the step of permuting each co-set comprises:
    reading each co-set in a row-by-row manner into an array having $N_1$ columns and $N_2$ rows where $N_1 \times N_2$ is equal to N/n where N is a number of elements in said block and n is a number of co-sets;
    choosing prime numbers $P_1<N_1$ and $P_2<N_2$;
    determining $\alpha_1$ and $\alpha_2$ as the roots of $P_1$ and $P_2$;
    selecting values $\beta_1$ and $\beta_2$;
    permuting the row indices of said array as a function of $\alpha_1$ and $\beta_1$;
    permuting the column indices of said array as a function of $\alpha_2$ and $\beta_2$;
    cyclically shifting each row of said array by a predetermined number of rows;
    cyclically shifting each column of said array by a predetermined number of columns; and
    reading each co-set out of said array in a column-by-column manner.

6. The method according to claim 1 wherein the step of permuting each co-set comprises generating an m-sequence according to each co-set.

7. The method according to claim 1, further comprising:
    encoding a stream of system elements in a first encoder to produce a first stream of Turbo elements, said stream of system elements constituting said block of data elements, the forming resulting in formation of a permuted stream of system elements as the permuted block;
    encoding the permuted system elements in a second encoder to produce a second stream of Turbo elements; and
    combining said first and second means of Turbo elements in a further predetermined order.

8. The method according to claim 7 wherein the step of partitioning said stream of system elements into co-sets comprises assigning to each of n co-sets elements whose relative positions in said stream have a common value of (N modulo(n)) where N is a number of elements in said stream of system elements.

9. The method according to claim 7 wherein said combining of said first and second streams of N turbo elements includes puncturing of said first and second streams of Turbo elements to maintain a predetermined ratio of system elements to Turbo elements.

10. The method according to claim 9 wherein said predetermined ratio is 1/2 and the value of n is 2, whereby said Turbo code includes at least one element corresponding to each system element.

11. Apparatus for permuting a block of data elements, comprising:
    means for partitioning said block into a plurality of co-sets;
    means for permuting each co-set; and
    means for forming a permuted block by combining elements of said permuted co-sets in a predetermined order.

12. The apparatus according to claim 11 wherein:
    said block contains N data elements, where N is a positive integer greater than 1 and integrally divisible by n, a positive integer greater than 1; and
    the means for partitioning said block into co-sets assigns to each of n co-sets elements whose relative positions in said block have a common value of (N modulo(n)).

13. The apparatus according to claim 12 wherein the value of n is 2,
   whereby a first co-set contains all odd-numbered elements of said block and a second co-set contains all even-numbered elements of said block.

14. The apparatus according to claim 11 wherein the means for permuting each co-set comprises:
   means for reading each co-set in a row-by-row manner into an array having $N_1$ columns and $N_2$ rows where $N_1 \times N_2$ is equal to N/n where N is a number of elements in said block and n is a number of co-sets;
   means for choosing prime numbers $P_1 < N_1$ and $P_2 < N_2$;
   means for determining $\alpha_1$ and $\alpha_2$ as the roots of $P_1$ and $P_2$;
   means for selecting values $\beta_1$ and $\beta_2$;
   means for permuting the row indices of said array as a function of $\alpha_1$ and $\beta_1$;
   means for permuting the column indices of said array as a function of $\alpha_2$ and $\beta_2$;
   means for cyclically shifting the rows of said array by $\beta_1$ rows;
   means for cyclically shifting the columns of said array by $\beta_2$ columns; and
   means for reading each co-set out of said array in a column-by-column manner.

15. The apparatus according to claim 11 wherein the means for permuting each co-set comprises:
   means for reading each co-set in a row-by-row manner into an array having $N_1$ columns and $N_2$ rows where $N_1 \times N_2$ is equal to N/n where N is a number of elements in said block and n is a number of co-sets;
   means for choosing prime numbers $P_1 < N_1$ and $\beta_2 < N_2$;
   means for determining $\alpha_1$ and $\alpha_2$ as the roots of $\beta_1$ and $\beta_2$;
   means for selecting values $\beta_1$ and $\beta_2$;
   means for permuting the row indices of said array as a function of $\alpha_1$ and $\beta_1$;
   means for permuting the column indices of said array as a function of $\alpha_2$ and $\beta_2$;
   means for cyclically each row of said array by a predetermined number of rows;
   means for cyclically shifting each column of said array by a predetermined number of columns; and
   means for reading each co-set out of said array in a column-by-column manner.

16. The apparatus according to claim 11 wherein the means for permuting each co-set comprises means for generating an m-sequence according to each co-set.

17. An apparatus according to claim 11, comprising,
   means for encoding a stream of system elements to produce a first stream of Turbo elements, said stream of Turbo elements constituting said block of data elements; said means for forming resulting in formation of a permuted stream of system elements as the permuted block;
   means for encoding the permuted stream of system elements to produce a second stream of Turbo elements; and
   means for combining said first and second streams of the Turbo elements in a further predetermined order.

18. The apparatus according to claim 17 wherein the means for partitioning said stream of system elements into co-sets assigns to each of n co-sets elements whose relative positions in said stream have a common value of (N modulo(n)) where N is a number of elements in said stream of system elements.

19. The apparatus according to claim 17 wherein said means for combining said first and second streams of N turbo elements punctures said first and second streams of Turbo elements to maintain a predetermined ratio of system elements to Turbo elements.

20. The apparatus according to claim 19 wherein said predetermined ratio is 1/2 and the value of n is 2, whereby said Turbo code includes at least one element corresponding to each system element.

21. An apparatus according to claim 11, wherein said means for partitioning includes partitioning logic, said means for permuting including permuting the logic, said forming means including combining the logic.

22. The system according to claim 21 wherein:
   said block contains N data elements, where N is a positive integer greater than 1 and integrally divisible by n, a positive integer greater than 1; and
   said partitioning logic assigns to each of n co-sets elements whose relative positions in said block have a common value of (N modulo(n)).

23. The system according to claim 22 wherein the value of n is 2,
   whereby a first co-set contains all odd-numbered elements of said block and a second co-set contains all even-numbered elements of said block.

24. The system according to claim 21 wherein said permuting logic comprises:
   read-in logic storing each co-set in a row-by-row manner into an array having $N_1$ columns and $N_2$ rows where $N_1 \times N_2$ is equal to N/n where N is a number of elements in said block and n is a number of co-sets;
   arithmetic logic configured to:
     choose prime numbers $P_1 < N_1$ and $P_2 < N_2$;
     determine $\alpha_1$ and $\alpha_2$ as the roots of $P_1$ and $P_2$; and
     select values $\beta_1$ and $\beta_2$,
   data manipulation logic configured to:
     permute the row indices of said array as a function of $\alpha_1$ and $\beta_1$;
     permute the column indices of said array as a function of $\alpha_2$ and $\beta_2$;
     cyclically shift the rows of said array by $\beta_1$ rows; and
     cyclically shift the columns of said array by $\beta_2$ columns, and
   read-out logic reading each co-set out of said array in a column-by-column manner.

25. The system according to claim 21 wherein said permuting logic comprises:
   read-in logic storing each co-set in a row-by-row manner into an array having $N_1$ columns and $N_2$ rows where $N_1 \times N_2$ is equal to N/n where N is a number of elements in said block and n is a number of co-sets;
   arithmetic logic configured to:
     choose prime numbers $P_1 < N_1$ and $P_2 < N_2$;
     determine $\alpha_1$ and $\alpha_2$ as the roots of $P_1$ and $P_2$; and
     select values $\beta_1$ and $\beta_2$,
   data manipulation logic configured to:
     permute the row indices of said array as a function of $\alpha_1$ and $\beta_1$;
     permute the column indices of said array as a function of $\alpha_2$ and $\beta_2$;
     cyclically shift each row of said array by a predetermined number of rows; and
     cyclically shift each column of said array by a predetermined number of columns, and
   read-out logic reading each co-set out of said array in a column-by-column manner.

26. The system according to claim 21 wherein the permuting logic generates an m-sequence according to each co-set.

27. An apparatus as in claim 17, wherein the means for encoding the system elements includes a first encoder configured to encode the system elements to produce the first stream of Turbo elements, the means for partitioning including partitioning logic configured to partition said stream of system elements into the plurality of co-sets, the means for permuting including permuting logic configured to permute each co-set, the means for forming including first combining logic configures to form the permuted stream of system elements by combining said permuted co-sets, the means for encoding the permuted stream of system elements being configured to produce the second stream of Turbo elements, the means for combining including second combining logic configured to combine the first and second streams of the Turbo elements.

28. The system according to claim 27 wherein the partitioning logic assigns to each of n co-sets elements whose relative positions in said stream have a common value of (N modulo(n)) where N is a number of elements in said stream of system elements.

29. The system according to claim 27 wherein said second combining logic punctures said first and second streams of Turbo elements to maintain a predetermined ratio of system elements to Turbo elements.

30. The system according to claim 29 wherein said predetermined ratio is 1/2 and the value of n is 2, whereby said Turbo code includes at least one element corresponding to each system.

* * * * *

UNITED STATES PATENT AND TRADEMARK OFFICE
CERTIFICATE OF CORRECTION

PATENT NO.    : 6,427,214 B1
DATED         : July 30, 2002
INVENTOR(S)   : Bin Li et al.

It is certified that error appears in the above-identified patent and that said Letters Patent is hereby corrected as shown below:

Column 9,
Line 41, after "cyclically" insert -- shifting --.

Signed and Sealed this

Eleventh Day of February, 2003

JAMES E. ROGAN
*Director of the United States Patent and Trademark Office*